US008546879B2

(12) United States Patent
Disney et al.

(10) Patent No.: US 8,546,879 B2
(45) Date of Patent: Oct. 1, 2013

(54) HIGH DENSITY LATERAL DMOS WITH RECESSED SOURCE CONTACT

(75) Inventors: Donald R. Disney, Cupertino, CA (US); Lei Zhang, Chengdu (CN); Tiesheng Li, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 13/213,011

(22) Filed: Aug. 18, 2011

(65) Prior Publication Data

US 2013/0043534 A1    Feb. 21, 2013

(51) Int. Cl.
*H01L 29/66*    (2006.01)

(52) U.S. Cl.
USPC .................. 257/335; 257/343; 257/E29.256

(58) Field of Classification Search
USPC .................. 257/296–304, E29.256–E29.261, 257/335, 336, 343, 344
See application file for complete search history.

(56) References Cited

U.S. PATENT DOCUMENTS

| 4,503,598 | A  | * | 3/1985  | Vora et al. .................... 438/274 |
| 5,466,616 | A  | * | 11/1995 | Yang ............................ 438/197 |
| 5,910,668 | A  | * | 6/1999  | Disney .......................... 257/329 |
| 6,110,763 | A  | * | 8/2000  | Temple ......................... 438/133 |
| 6,252,278 | B1 |   | 6/2001  | Hsing |
| 6,518,138 | B2 |   | 2/2003  | Hsing |
| 2007/0072416 | A1 | * | 3/2007 | Grivna et al. ................. 438/655 |
| 2007/0138548 | A1 | * | 6/2007 | Kocon et al. .................. 257/336 |
| 2009/0032868 | A1 | * | 2/2009 | Chen et al. .................... 257/336 |

* cited by examiner

*Primary Examiner* — Selim Ahmed
(74) *Attorney, Agent, or Firm* — Perkins Coie LLP

(57) ABSTRACT

The present disclosure discloses a lateral DMOS with recessed source contact and method for making the same. The lateral DMOS comprises a recessed source contact which has a portion recessed into a source region to reach a body region of the lateral DMOS. The lateral DMOS according to various embodiments of the present invention may have greatly reduced size and may be cost saving for fabrication.

5 Claims, 14 Drawing Sheets

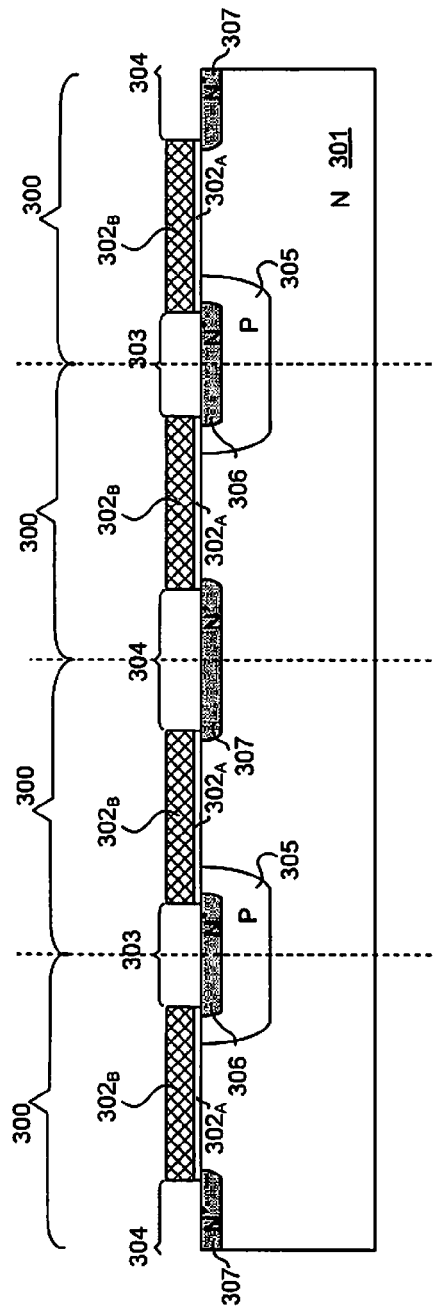 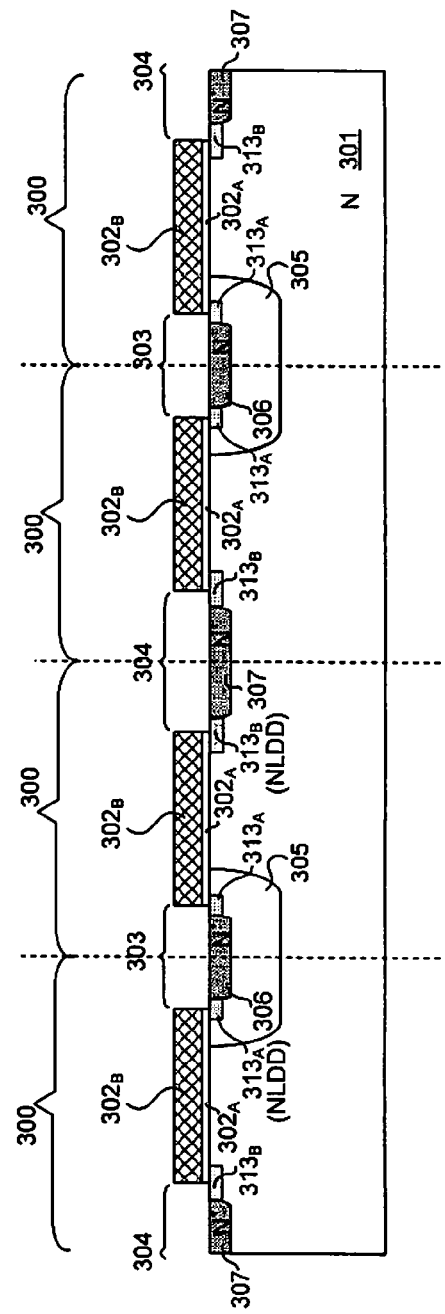
*FIG. 3C*  *FIG. 3C'*

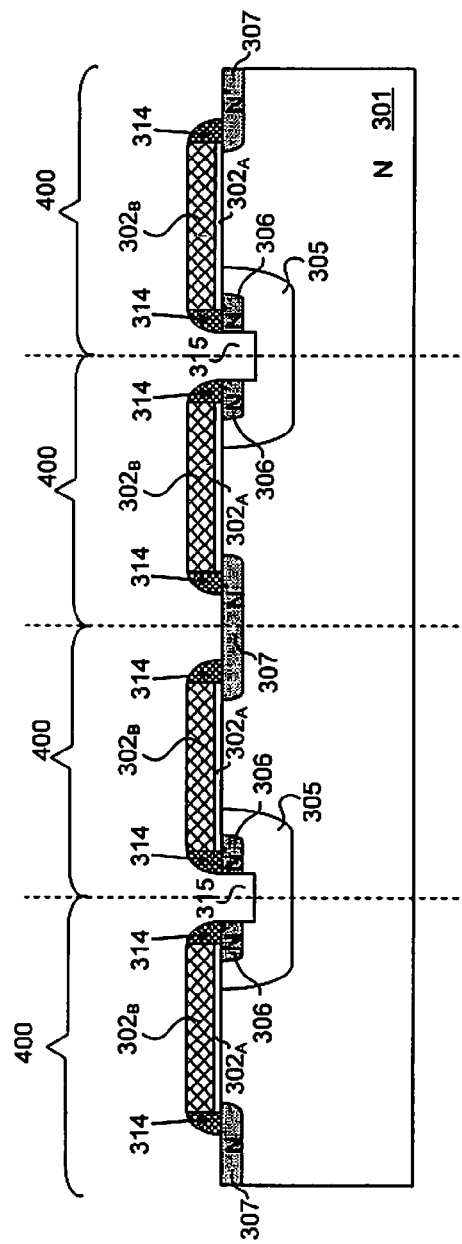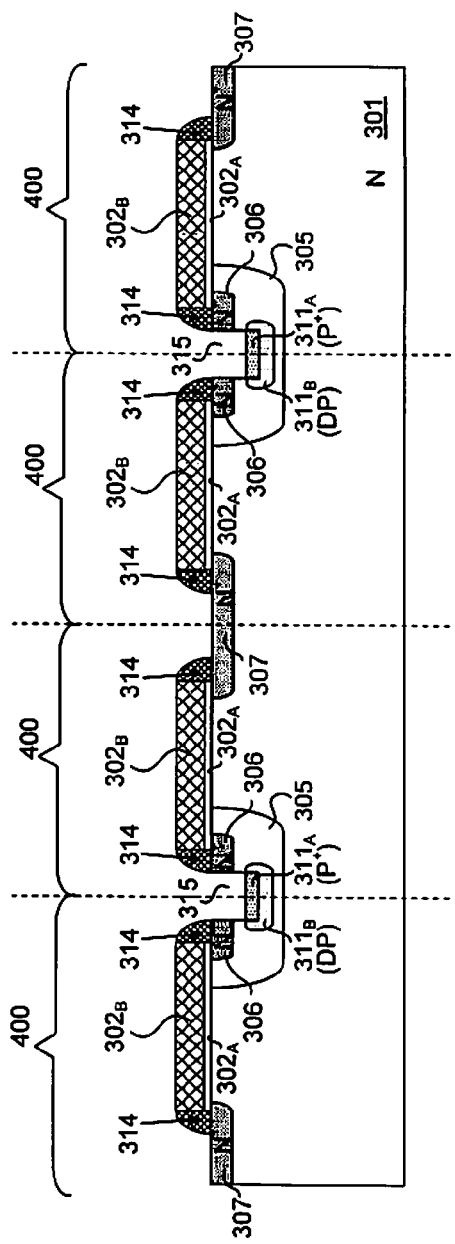
FIG. 4C
FIG. 4D

HIGH DENSITY LATERAL DMOS WITH RECESSED SOURCE CONTACT

TECHNICAL FIELD

This disclosure relates generally to semiconductor devices, and particularly relates to lateral double diffused metal oxide semiconductor transistors.

BACKGROUND

Lateral double diffused metal oxide semiconductor transistors (DMOS) are commonly used in power management integrated circuits (IC) as power transistors which are switched ON or OFF in response to control signals to realize power conversion.

FIG. 1A illustrates a sectional view of a lateral DMOS 100. The lateral DMOS 100 may be formed in a P-type semiconductor substrate 101. The lateral DMOS 100 may further have a N-type drift region 102 formed in the P-type semiconductor substrate 101, a P-type body region 103 in the N-type drift region 102, a source region 104 in the P-type body region 103, a drain region 105 in the N-type drift region 102, a gate region 106 atop a portion of the N-type drift region 102, which is between the source region 104 and the drain region 105, and a source contact 109, a drain contact 110 and a gate contact (not shown in FIG. 1A) respectively contacting the source region 104, the drain region 105, and the gate region 106. An interlayer dielectric layer 111 is provided to prevent shorting between the source contact 109 and the gate region 106, as well as between the drain contact 110 and the gate region 106.

The source region 104 may comprise a heavy doped N-type ($N^+$) region. The drain region 105 may also comprise a heavy doped N-type ($N^+$) region. The gate region 106 may comprise a poly-silicon layer $106_A$ wrapped by an isolation layer $106_B$. The gate region 106 may cover a portion of the source region 104 and the body region 103, the gate region 106 may also cover a portion of the drain region 105.

Typically, the lateral DMOS 100 may further comprise a heavy doped P-type ($P^+$) region 107 and/or another P-type doped (DP) region 108 having a lower dopant concentration than the $P^+$ region 107. The $P^+$ region 107 may be formed in the source region 104 and the DP region 108 may be formed below the $P^+$ region 107. The $P^+$ region 107 and the DP region 108 are provided to function as a body contact region between the P-type body region 103 and the source contact 109 so as to reduce a resistance of the body region 103 under the source region 104, from the source contact 109 to the end of the source region 104 closest to the gate region 106, thus reducing a base resistance of a parasitic NPN transistor formed by using respectively the N-type drift region 102, the P-type body region 103, and the source region 104 as respectively a collector, a base and an emitter, thereby increasing the ruggedness of the lateral DMOS 100.

Methods and processes of forming the lateral DMOS 100 are well known to those skilled in the art and are not addressed in detail herein. FIG. 1B illustrates a sectional view of a portion of the lateral DMOS 100 to show a source opening 112. The source opening 112 may be formed after the formation of the gate region 106 to expose a portion of the body region 103 so that in the following the source region 104, the $P^+$ region 107 and/or the DP region 108 can be formed in the exposed portion of the body region 103. The source opening 112 shown in FIG. 1B is shared by two neighboring individual lateral DMOS 100 and is confined between two neighboring gate regions 106 of the two neighboring individual lateral DMOS 100. The source opening 112 should have an appropriate size so that the source region 104, the $P^+$ region 107 and/or the DP region 108 and the source contact 109 can be appropriately formed. It can be seen from FIG. 1B that the source opening 112 has a width $L_S$ that may be expressed by $L_S = L_{CT} + 2L_{CT\text{-}gate}$, wherein $L_{CT}$ represents a width of the source contact 109 shared by the two neighboring individual lateral DMOS 100, $L_{CT\text{-}gate}$ represents a width from an edge $E_{CT}$ of the source contact 109 to an edge $E_{gate}$ of the gate region 106.

Typically, the source contact 109 should cover both the $P^+$ region 107 and a portion of the $N^+$ source region 104. That is to say, the width $L_{CT}$ of the source contact 109 should be large enough. Moreover, the $P^+$ region 107 has a width that depends on a width of a photoresist layer which is supposed to cover an area where the $P^+$ region 107 is supposed to be formed when forming the $N^+$ source region 104. However, the width of the photoresist layer should not be smaller than a minimum acceptable photoresist width; otherwise the photoresist layer may be deformed or even fall aside. Thus, the width of the $P^+$ region 107 can not be smaller than the minimum acceptable photoresist width, resulting in the width $L_{CT}$ of the source contact 109 being relatively large.

The width $L_{CT\text{-}gate}$ should also be large enough at least to ensure that accidental shorting between the source contact 109 and the poly-silicon layer $106_A$ of the gate region 106 should not occur. Further, the width $L_{CT\text{-}gate}$ may be expressed by $L_{CT\text{-}gate} = L_{CT\text{-}DP} + L_{DP\text{-}gate}$, wherein $L_{CT\text{-}DP}$ represents a width from the edge $E_{CT}$ of the source contact 109 to an edge $E_{DP}$ of the DP region 108, and $L_{DP\text{-}gate}$ represents a width from the edge $E_{DP}$ of the DP region 108 to the edge $E_{gate}$ of the gate region 106. The width $L_{DP\text{-}gate}$ should not be too small, because a minimum distance should be kept from the edge $E_{DP}$ of the DP region 108 to the edge $E_{gate}$ of the gate region 106 to ensure that the DP region 108 does not affect a channel threshold of the lateral DMOS 100. Thus, the width $L_{CT\text{-}gate}$ may also be relatively large.

In addition, in the process of forming the source region 104, the $P^+$ region 107 and/or the DP region 108 and the source contact 109, at least four photoresist layers and four mask layers should be applied, i.e. a first photoresist layer and a first mask layer for forming the DP region 108; a second photoresist layer and a second mask layer for forming the $N^+$ source region 104; a third photoresist layer and a third mask layer for forming the $P^+$ region 107; and a fourth photoresist layer and a fourth mask layer for forming the source contact 109. The width $L_{CT}$ and the width $L_{CT\text{-}gate}$ are directly or indirectly defined by the first, second, third and fourth photoresist layers and mask layers. For each photoresist layer and each mask layer, mask misalignment should be taken into account.

Therefore, for the lateral DMOS 100, the width $L_S$ of the source opening 112 may be relatively large, which results in a larger size of the lateral DMOS 100. In addition, at least four photoresist layers and four mask layers should be applied for forming the source region 104, the $P^+$ region 107 and/or the DP region 108 and the source contact 109, and the width $L_S$ of the source opening 112 depends on the four photoresist layers and the four mask layers, wherein, for each mask layer, mask misalignment should be taken into account. Thus, the forming of a traditional lateral DMOS 100 could be rather complicated and the cost is high.

SUMMARY

In one embodiment, a semiconductor device comprises; an initial layer of a first conductivity type; a body region of a second conductivity type having a first dopant concentration, wherein the body region is located in the initial layer; a source region of the first conductivity type, wherein the source region is located in the body region; a drain region of the first conductivity type, wherein the drain region is located in the initial layer; a gate atop a portion of the initial layer, wherein the portion of the initial layer is between the source region and the drain region; and a recessed source contact comprising a recessed portion extending vertically through the source region to reach the body region, wherein the recessed portion is electrically coupled to the source region and the body region.

In one embodiment, a method of manufacturing a semiconductor device comprises: providing an initial layer of a first conductivity type; forming a gate atop the initial layer, wherein a source opening and a drain opening are formed after the gate is formed, and wherein the gate is laterally positioned between the source opening and the drain opening; forming a body region of a second conductivity type having a first dopant concentration in the initial layer via the source opening; forming a source region of the first conductivity type in the body region via the source opening; forming a drain region of the first conductivity type in the initial layer via the drain opening; and forming a recessed source contact comprising a recessed portion extending vertically through the source region to reach the body region, wherein the recessed portion is electrically coupled to the source region and the body region.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features.

FIG. 3C' illustrates a sectional view of a variant step of forming a source region and a drain region of the lateral DMOS in accordance with an embodiment of the present invention.

FIG. 3D' illustrates a sectional view of a variant step of forming a source contact opening of the lateral DMOS in accordance with an embodiment of the present invention.

FIGS. 4A to 4G illustrate sectional views of another fabrication process of forming a lateral DMOS in accordance with another embodiment of the present invention.

The use of the same reference label in different drawings indicates the same or like components or structures with substantially the same functions for the sake of simplicity.

DETAILED DESCRIPTION

Various embodiments of the technology will now be described. In the following description, some specific details, such as example circuits and example values for these circuit components, are included to provide a thorough understanding of embodiments. One skilled in the relevant art will recognize, however, that the technology can be practiced without one or more specific details, or with other methods, components, materials, etc. In other instances, well-known structures, materials, processes or operations are not shown or described in detail to avoid obscuring aspects of the technology.

The terms "left," right," "in," "out," "front," "back," "up," "down, "top," "atop", "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner.

Figure 1A:
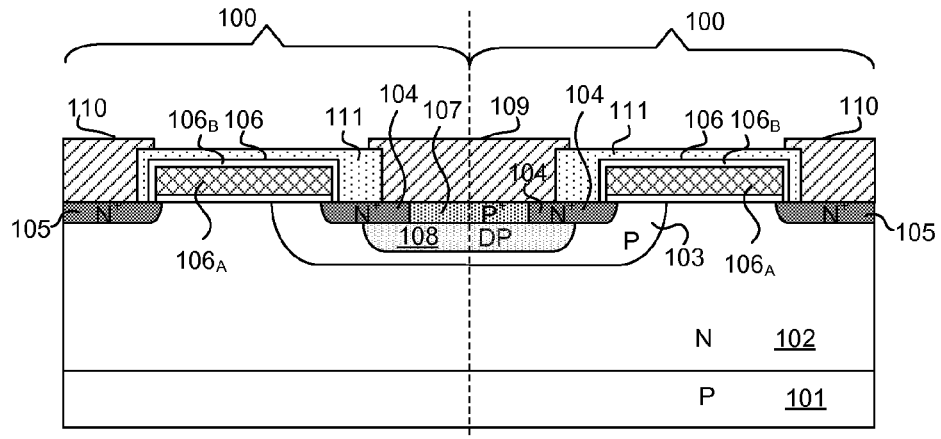
FIG. 1A illustrates a sectional view of an existing lateral DMOS.
Figure 1B:
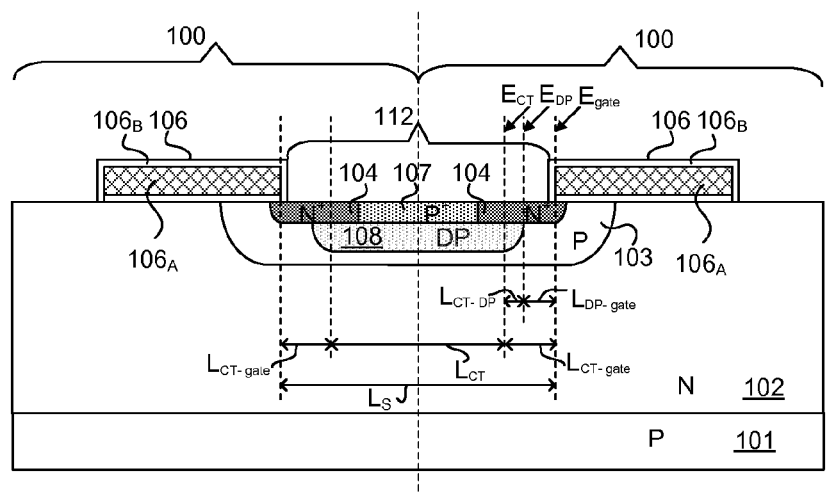
FIG. 1B illustrates a sectional view of a portion of the lateral DMOS of FIG. 1A to show a source opening.
Figure 2A:
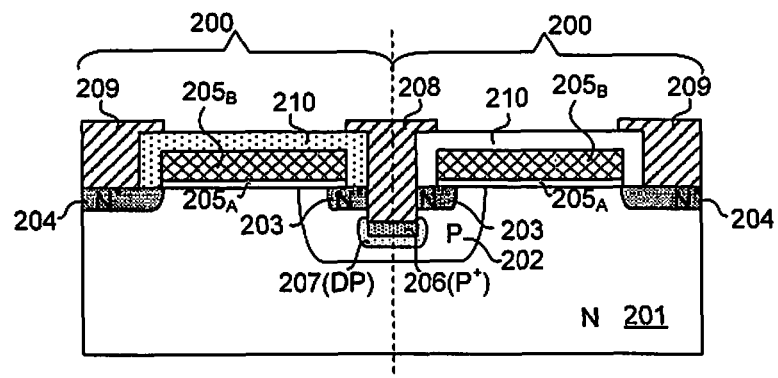
FIGS. 2A to 2F show sectional views of a lateral DMOS in accordance with various embodiments of the present invention.

FIG. 2A illustrates a sectional view of a lateral DMOS 200 in accordance with an embodiment of the present invention. The lateral DMOS 200 comprises an initial layer 201 of a first conductivity type (e.g. N-type in FIG. 2A); a body region 202 of a second conductivity type opposite to the first conductivity type (e.g. P-type in FIG. 2A) having a first dopant concentration, wherein the body region 202 is located in the initial layer 201; a source region 203 of the first conductivity type with a heavy dopant concentration (e.g. an $N^+$ region in FIG. 2A), wherein the source region 203 is located in the body region 202; a drain region 204 of the first conductivity type with a heavy dopant concentration (e.g. an $N^+$ region in FIG. 2A), wherein the drain region 204 is located in the initial layer 201; and a gate 205 positioned atop a portion of the initial layer 201, which portion is between the source region 203 and the drain region 204. The lateral DMOS 200 further comprises a recessed source contact 208, which comprises a recessed portion extending vertically through the source region 203 to reach the body region 202, wherein the recessed portion is electrically coupled to the source region 203 and the body region 202. Similar to the conventional lateral DMOS 100, the lateral DMOS 200 may further comprise a drain contact 209 and a gate contact (not shown in FIG. 2A) respectively coupled to the drain region 204 and the gate 205.

The lateral DMOS 200 shown in FIG. 2A is just for purpose of illustration and should not be considered to be limiting. According to various embodiments of the present invention, the initial layer 201 of the first conductivity type may be provided and formed on other layers (not shown in FIG. 2A) that are compatible with various features of various embodiments of the lateral DMOS 200 and are compatible with other aspects of the device manufacturing process. For example, in one embodiment, the initial layer 201 may be provided and formed on a semiconductor substrate of the second conductivity type; in other embodiment, the initial layer 201 may be provided on an epitaxial layer of the second conductivity type which may be formed on a semiconductor substrate of the second conductivity type; in still other embodiment, the initial layer 201 may even be provided and formed on a silicon dioxide (SOI) layer which may be formed on a semiconductor substrate of the second conductivity type. Various embodiments of the present invention intend to cover any equivalent modifications and variations wherein the initial layer 201 is provided and the lateral DMOS 200 is manufactured on the initial layer 201

In one embodiment, the recessed portion of the recessed source contact 208 may extend deeper into the body region 202 than the source region 203.

In one embodiment, a portion of the source region 203 may extend below the gate 205. Similarly, a portion of the drain region 204 may also extend below the gate 205

In one embodiment, the gate 205 may comprise a first isolation layer $205_A$ and a gate conduction layer $205_B$ atop the first isolation layer $205_A$. In one embodiment, the gate conduction layer $205_B$ may comprise doped polysilicon and the first isolation layer $205_A$ may comprise silicon dioxide. In other embodiments, the gate conduction layer $205_B$ may comprise a layer formed of other conductive materials (e.g., metals, other semiconductors, semi-metals, and/or combinations thereof) that are compatible with other aspects of the device manufacturing process.

Figure 2B:
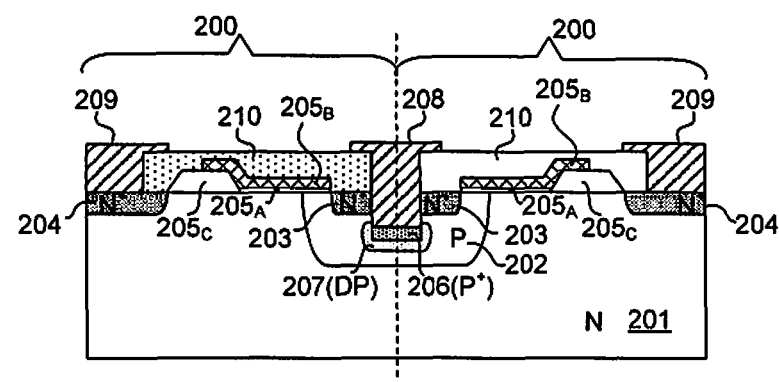

In other embodiment, as illustrated in FIG. 2B, the gate 205 may further comprise a thick dielectric layer $205_C$ (e.g. field oxide) over a portion of the initial layer 201 to laterally separate the drain region 204 from the closest edge of gate conduction layer $205_B$, wherein the gate conduction layer $205_B$ may have a portion extending on top of the thick dielectric layer $205_C$. In one embodiment, the thick dielectric layer $205_C$ may also comprise silicon dioxide.

In other embodiment, the lateral DMOS 200 may further comprise a first body contact region 206 of the second conductivity type having a second dopant concentration (e.g. a P+ region in FIG. 2A), which is below and in contact with the recessed source contact 208, wherein the second dopant concentration is higher than the first dopant concentration. In still other embodiment, the lateral DMOS 200 may further comprise a second body contact region 207 of the second conductivity type having a third dopant concentration (e.g. a DP region in FIG. 2A), which encloses the first body contact region 206 and is in contact with the first body contact region 206, wherein the third dopant concentration is higher than the first dopant concentration and is smaller than the second dopant concentration. In an exemplary embodiment, the second dopant concentration is at least one hundred times of the first dopant concentration, and the third dopant concentration is at least ten times of the first dopant concentration.

In one embodiment, the lateral DMOS 200 may further comprise a second isolation layer 210 wrapping the gate 205. The second isolation layer 210 is provided to prevent shorting between the recessed source contact 208 and the gate 205, as well as between the drain contact 209 and the gate 205, as illustrated in FIG. 2A. In one embodiment, the second isolation layer 210 may comprise silicon dioxide. In other embodiment, the second isolation layer 210 may further comprise other dielectric materials that are compatible with other aspects of the device manufacturing process.

Figure 2C:
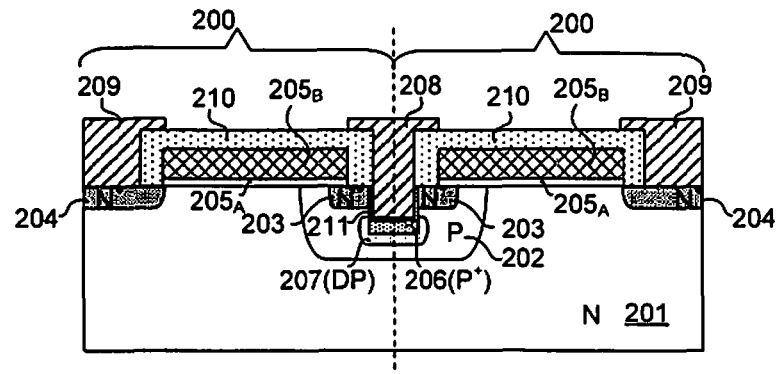

In other embodiment, as illustrated in FIG. 2C the lateral DMOS 200 may further comprise a silicide layer 211 for improving connection between the recessed source contact 208 and the source region 203, the first body contact region 206 and/or the second body contact region 207. In one embodiment, the silicide layer 211 may be formed atop the first body contact region 206 and along sidewalls of the recessed portion of the recessed source contact 208 (FIG. 2C). In other embodiment, the first body contact region 206 may not be formed; the silicide layer 211 may be formed atop the second body contact region 207 and along sidewalls of the recessed portion of the recessed source contact 208 (not shown). In one embodiment, the silicide layer 211 may comprise a titanium-silicon or a cobalt-silicon self-aligned silicide layer.

Figure 2D:
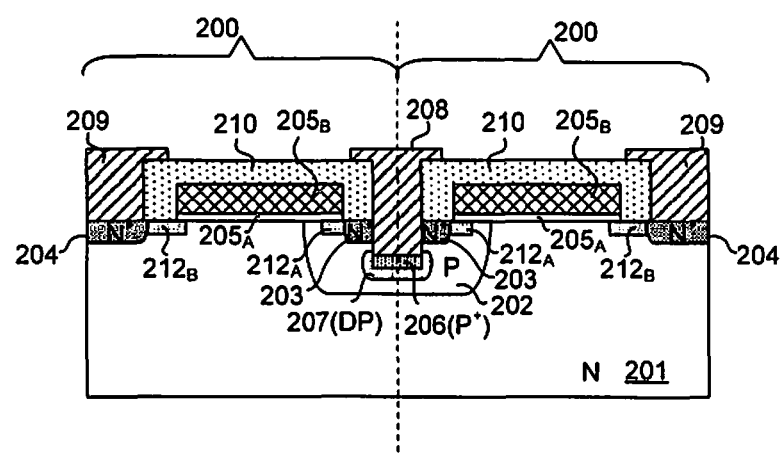

In still other embodiment, as illustrated in FIG. 2D, the source region 203 may not extend below the gate 205. A first lightly doped layer $212_A$ of the first conductivity type (e.g. an NLDD layer in FIG. 2D) may be formed in the body region 204, wherein the first lightly doped layer $212_A$ may be beside and in contact with the source region 203. Further, the first lightly doped layer $212_A$ may extend below the gate 205. Similarly, in yet other embodiment, the drain region 204 may not extend below the gate 205, instead, a second lightly doped layer $212_B$ of the first conductivity type (e.g. an NLDD layer in FIG. 2D), which maybe formed in the initial layer 201, and may be beside and in contact with the drain region 204, extends below the gate 205.

Figure 2E:
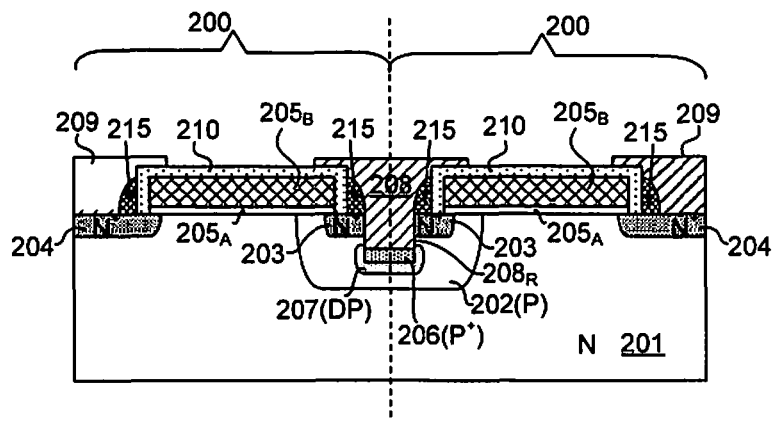
Figure 2F:
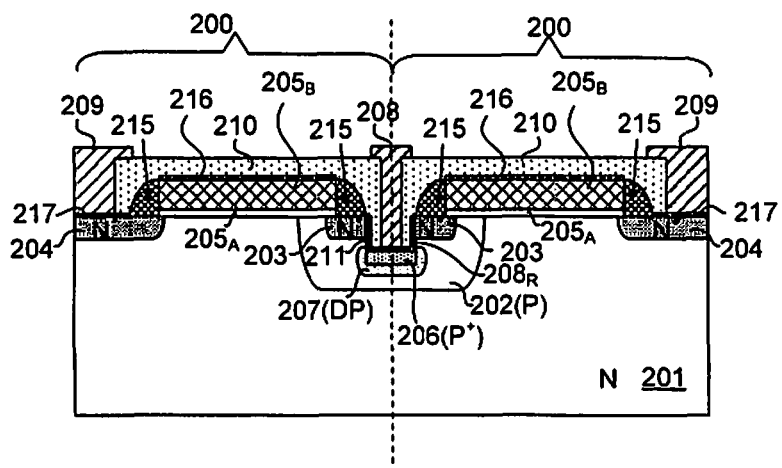

In yet other embodiment, as illustrated in FIG. 2E and 2F, the lateral DMOS 200 may further comprise a spacer 215 adjacent to each side of the gate 205. The spacer 215 is provided for self-aligned source contact recess etching. A source contact recess $208_R$ is etched vertically through the source region 203 to reach the body region 202 with sidewalls self-aligned to the spacer 215. In one exemplary embodiment as illustrated in FIG. 2E, the spacer 215 may be formed after the isolation layer 210 is formed. In this case, the spacer 215 is beside each side of the isolation layer 210; the recessed source contact 208 may be formed directly in the source contact recess $208_R$ and contact the source region 203, the first body contact region 206 and/or the second body contact region 207.

In another exemplary embodiment as illustrated in FIG. 2F, the spacer 215 may be formed before the isolation layer 210 is formed. In this case, the spacer 215 is beside each side of the gate 205 and is covered by the isolation layer 210; the recessed source contact 208 may be formed in a source contact opening etched through the isolation layer 210 in the source contact recess $208_R$, wherein the recessed source contact 208 may be electrically coupled to the source region 203, the first body contact region 206 and/or the second body contact region 207 via a silicide layer 211.

The spacer 215 may comprise a material that has different etching characteristics from the gate 205, the isolation layer 210, the source region 203 and the body region 202. For example, in one embodiment, the spacer 215 may comprise a material that is easier to be etched than the isolation layer 210 and/or the gate 205 but is more difficult to be etched than the source region 203 and the body region 202. In other embodiment, the spacer 215 may comprise a material that needs different etching agent from that needed by the isolation layer 210 and/or the gate 205, the source region 203 and the body region 202. In other embodiment, a thin protecting layer may be formed over the gate 205 for protecting the gate 205 being etched while forming the spacer 215 in the case that the spacer 215 is formed before the formation of the isolation layer 210.

In yet other embodiment, as illustrated in FIG. 2F, the lateral DMOS 200 may further comprise a silicide layer 216 atop the gate 205 for improving connection between the gate contact (not shown) and the gate 205. In still other embodiment, also illustrated in FIG. 2F, the lateral DMOS 200 may further comprise a silicide layer 217 atop the drain region 204 for improving connection between the drain contact 209 and the drain region 204.

Figure 2G:
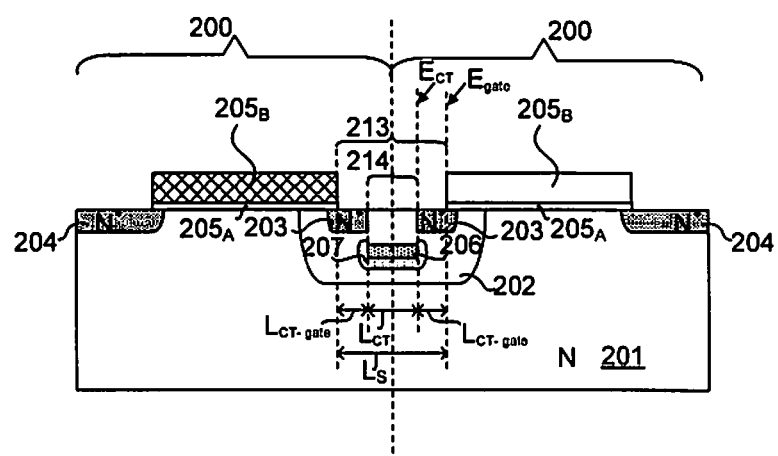
FIG. 2G shows a sectional view of a portion of the lateral DMOS in accordance with an embodiment of the present invention for illustrating a source opening of the lateral DMOS.

FIG. 2G shows a sectional view of a portion of the lateral DMOS 200 for illustrating a source opening 213 of the lateral DMOS 200 in accordance with an embodiment of the present invention. The source opening 213, which is aimed to expose a portion of the body region 202, should be formed after forming the gate 205, so that in the following the source region 203, the first body contact region 206 and/or the second body contact region 207 can be formed in the exposed portion of the body region 202. In accordance with an embodiment of the present invention, the source region 203 may be formed by implanting a substance of the first conductivity type with a heavy dopant concentration into the body region 202 via the source opening 213. Subsequently, in one embodiment, the isolation layer 210 may be formed and a source contact opening 214 may be defined by a photoresist layer and a mask layer wherein the source contact opening 214 may extend through the isolation layer 210 and the source region 203 to reach the body region 202. In other embodiment, the source contact opening 214 may not be defined by a photoresist layer and a mask layer, instead, the spacer 215 is formed and the source contact opening 214 may be defined by self-alignment techniques with the shield of the spacer 215 to extend through the isolation layer 210 and the source region 203 to reach the body region 202. In one embodiment, in a following step, the first body contact region 206 may be formed by implanting a substance of the second conductivity type with the second dopant concentration into the body region 202 via the source contact opening 214. In other embodiment, the second body contact region 207 may be formed by implanting a substance of the second conductivity type with the third dopant concentration into the body region via the source contact opening 214 before forming the first body contact region 206. A fabrication process/method of forming a lateral DMOS with recessed source contact in accordance with an embodiment of the present invention will be discussed in more detail later in this disclosure.

The source opening 213 shown in FIG. 2G is shared by two neighboring individual lateral DMOS 200 and is confined between two neighboring gates 205 of the two neighboring individual lateral DMOS 200. The source opening 213 should have an appropriate size so that the source region 203, the first body contact region 206 and/or the second body contact region 207 and the recessed source contact 208 can be appropriately formed. It can be seen from FIG. 2G that the source opening 213 has a width $L_S$ that may be expressed by $L_S = L_{CT} + 2L_{CT\text{-}gate}$, wherein $L_{CT}$ represents a width of the source contact opening 214 shared by the two neighboring individual lateral DMOS 200, $L_{CT\text{-}gate}$ represents a width from an edge $E_{CT}$ of the source contact opening 214 to an edge $E_{gate}$ of the gate 205.

The lateral DMOS 200 in accordance with various embodiments of the present invention may feature a reduced size (a reduced source opening width $L_S$) of the source opening 213. Firstly, according to one embodiment of the present invention, the width $L_{CT}$ of the source contact opening 214 may be directly defined by a photoresist layer and a mask layer, wherein the photoresist layer has no minimum width requirement, thus, the source contact opening 214 could be defined as narrow as possible providing that it can allow dopant injection into the body region 202. Secondly, according to other embodiment of the present invention, the width $L_{CT}$ of the source contact opening 214 may be defined by the spacer 215, instead of by a photoresist layer and a mask layer. In this way, the fabrication cost may be further saved while the source contact opening 214 could still be defined as narrow as possible providing that it can allow dopant injection into the body region 202. Thirdly, the size of the source region 203 could be reduced because the recessed source contact 208 contacts the source region 203 vertically (along the exposed sidewall of the recessed source contact trench) instead of laterally covering the source region 203. Fourthly, the source region 203 may be formed without using a photoresist layer and a mask layer because with the shield of the gate 205, substance of the first conductivity type with a heavy dopant concentration could be implanted into the body region 202 directly via the source opening 213 to form the source region 203. Fifthly, the first body contact region 206 could be formed without using a photoresist layer and a mask layer because substance of the second conductivity type with the second dopant concentration could be directly implanted into the body region 202 via the source contact opening 214. Sixthly, the second body contact region 207 could also be formed without using a photoresist layer and a mask layer because substance of the second conductivity type with the third dopant concentration could also be directly implanted into the body region 202 via the source contact opening 214. Therefore, the size of the lateral DMOS 200 could be greatly reduced and up to three mask layers could be saved when forming the lateral DMOS 200, saving cost.

Another advantage of the present invention lies in improving the ruggedness (safe operating area) of the lateral DMOS 200, because a base resistance of a parasitic bipolar transistor, which may be formed by using the source region 203, the body region 202 and the initial layer 201, may be reduced. The base resistance of the parasitic bipolar transistor is proportional to a length of the base region, which is substantially the same as a length of the source region 203. The length of the source region 203 may be reduced by the self-alignment techniques described above. Moreover, a sheet resistance of the base region of the parasitic bipolar transistor is inversely proportional to the second conductivity type doping concentration under the source region 203, and this doping concentration is increased by introducing the heavy doping self-aligned to the gate 205 and/or into the bottom of the recessed source contact, as described above.

The advantages of the present invention are not confined to those described above. These and other advantages of the present invention will become more apparent upon reading the whole detailed descriptions and studying the various figures of the drawings.

FIGS. 3A to 3E illustrate a fabrication process of forming a lateral DMOS 300 in accordance with an embodiment of the present invention.

Figure 3A:
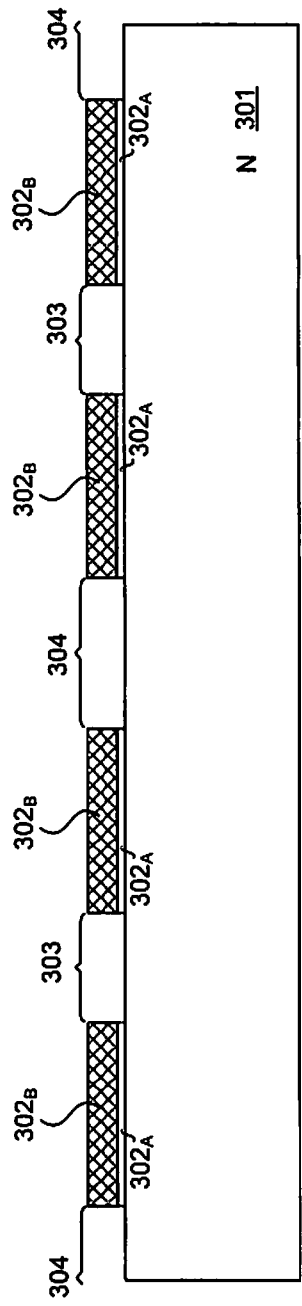
FIGS. 3A to 3E illustrate sectional views of a fabrication process of forming a lateral DMOS in accordance with an embodiment of the present invention.

As shown in FIG. 3A, at a first step, an initial layer 301 of a first conductivity type (e.g. N-type in FIG. 3A) is originally provided, and in the following, a gate 302 is formed atop the initial layer 301.

In one embodiment, forming the gate 302 may comprise: forming a first isolation layer $302_A$ atop the initial layer 301; forming a gate conduction layer $302_B$ atop the first isolation layer $302_A$; and etching the first isolation layer $302_A$ and the gate conduction layer $302_B$ into individual gates 302. In one embodiment, the gate conduction layer $302_B$ may comprise a doped polysilicon layer and the first isolation layer $302_A$ may comprise silicon dioxide. In other embodiments, the gate conduction layer $302_B$ may comprise other conductive materials (e.g., metals, other semiconductors, semi-metals, and/or combinations thereof) that are compatible with other aspects of the device manufacturing process. Thus, the term "polysilicon" is intended to include such other materials and material combinations in addition to silicon.

Continuing with FIG. 3A, after the formation of the gate 302, a source opening 303 and a drain opening 304 are also formed, wherein the gate 302 is laterally positioned between the source opening 303 and the drain opening 304.

Figure 3B:
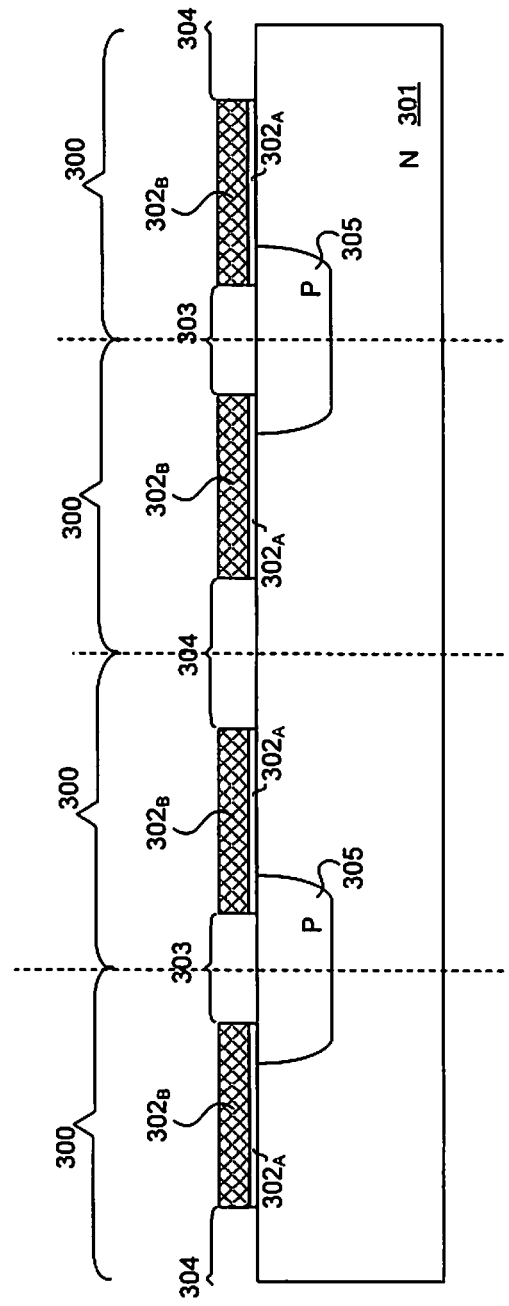

At a second step, as illustrated in FIG. 3B, a body region 305 of the second conductivity type with the first dopant concentration is formed in the initial layer 301 via the source opening 303.

At a third step, as illustrated in FIG. 3C, a source region 306 is formed in the body region 305 via the source opening 303. In one embodiment, a drain region 307 may also be formed at the same step when the source region 306 is formed. In other embodiments, the drain region 307 may be formed in a different step. In one embodiment, forming the source region 306 may comprise: implanting a substance of the first conductivity type (e.g. N-type in FIG. 3C) with a heavy dopant concentration into the body region 305 via the source opening 303. In other embodiments, forming the source region 306 may comprise other well known procedures. In one embodiment, forming the drain region 307 may comprise: implanting a substance of the first conductivity type (e.g. N-type in FIG. 3C) with a heavy dopant concentration into the initial layer 301 via the drain opening 304. In other embodiments, forming the drain region 307 may comprise other procedures.

In other embodiments, as illustrated in FIG. 3C', at the third step, the source region 306 may be formed not to extend below the gate 302, a first lightly doped region $313_A$ of the first conductivity type (e.g. an NLDD layer in FIG. 3C') may further be formed in the body region 305, wherein the first lightly doped region $313_A$ extends below the gate 302 and is beside and in contact with the source region 306. Similarly, in other embodiments, at the third step, the drain region 307 may be formed not to extend below the gate 302, a second lightly doped region $313_B$ of the first conductivity type (e.g. an NLDD layer in FIG. 3C') may be formed, wherein the second lightly doped region $313_B$ is formed in the initial layer 301, and is beside and in contact with the drain region 307, further, the second lightly doped region $313_B$ may also extend below the gate 302.

Figure 3D:
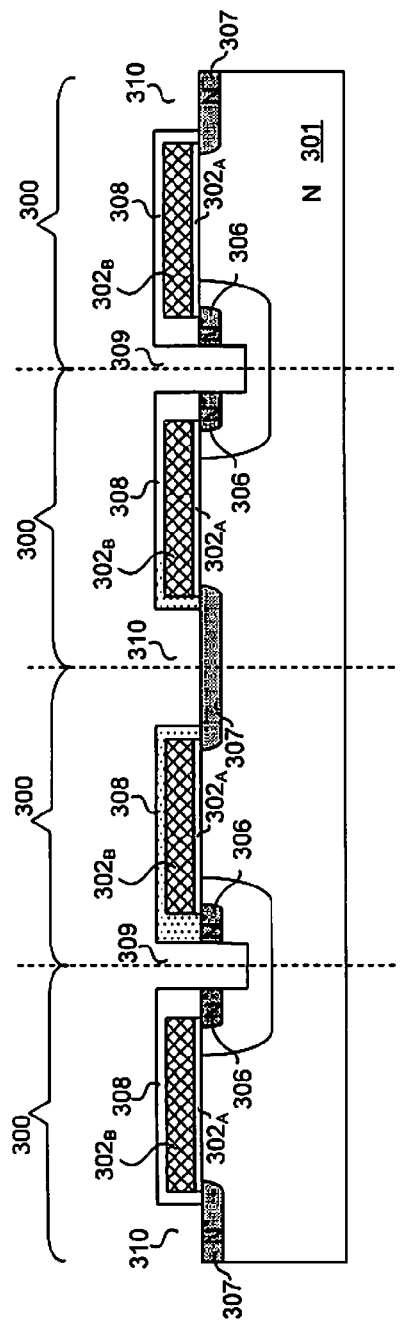
Figure 3D:
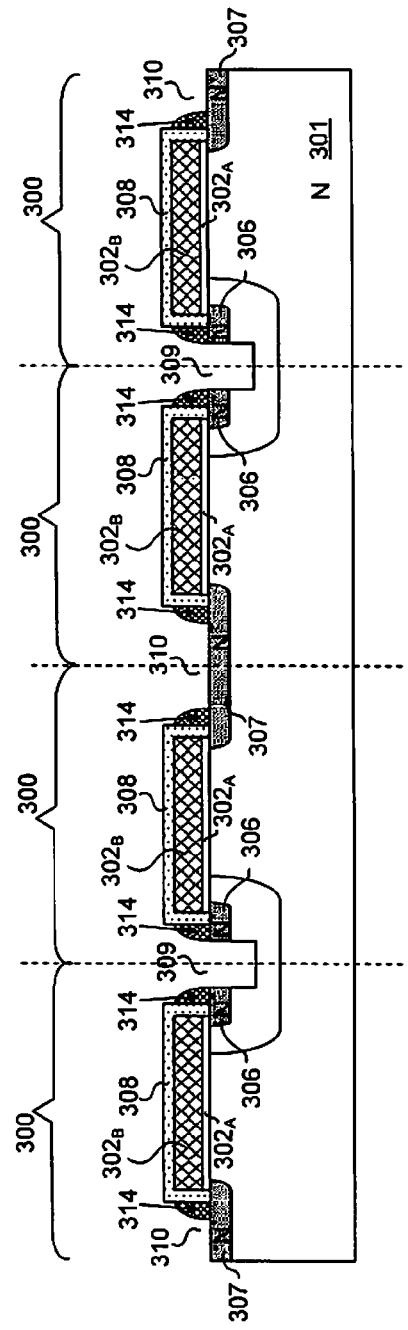

At a fourth step, as illustrated in FIG. 3D, a source contact opening 309 is formed in the source region 306 to reach the body region 305. In one embodiment, forming the source contact opening 309 may comprise: forming a second isolation layer 308 to wrap the gate 302; applying a first photoresist layer and a first mask layer to define the source contact opening 309 wherein the source contact opening 309 extends vertically through the source region 306 to reach the body region 305; and removing the first photoresist layer and the first mask layer. In other embodiment, forming the source contact opening 309 may comprise other procedures. In one embodiment, the source contact opening 309 extends deeper into the body region 305 than the source region 306. In one embodiment, a drain contact opening 310 is also formed at the same step when the source contact opening 309 is formed. In one embodiment, forming the drain contact opening 310 may comprise sharing the same first photoresist layer and the first mask layer to define the drain contact opening 310, wherein the drain contact opening 310 expose a portion of the drain region 307. In other embodiment, the drain contact opening 310 may be formed in a different step and may not share the same first photoresist layer and the first mask layer.

In still other embodiment, as illustrated in FIG. 3D', at the fourth step, Forming the source contact opening 309 may comprise: forming a second isolation layer 308 to wrap the gate 302; forming a spacer 314 at each side of the isolation layer 308; and etching the source region 306 with the shield of the spacer 314 to form the source contact opening 309 wherein the source contact opening 309 extends through the source region 306 to reach the body region 305. In the embodiment of FIG. 3D', a drain contact opening 310 may also be formed after the formation of the spacer 314.

In one embodiment, the second isolation layer 308 may comprise a silicon dioxide layer. In other embodiment, the second isolation layer 308 may comprise a layer formed of other isolation materials that are compatible with other aspects of the device manufacturing process.

In one embodiment, the spacer 314 may comprise a material that has different etching characteristics from the isolation layer 308, the source region 306 and the body region 305. For example, in one embodiment, the spacer 314 may comprise a material that is easier to be etched than the isolation layer 308, but is more difficult to be etched than the source region 306 and the body region 305. In other embodiment, the spacer 314 may comprise a material that needs different etching agent from that needed by the isolation layer 308, the source region 306 and the body region 305.

Figure 3E:
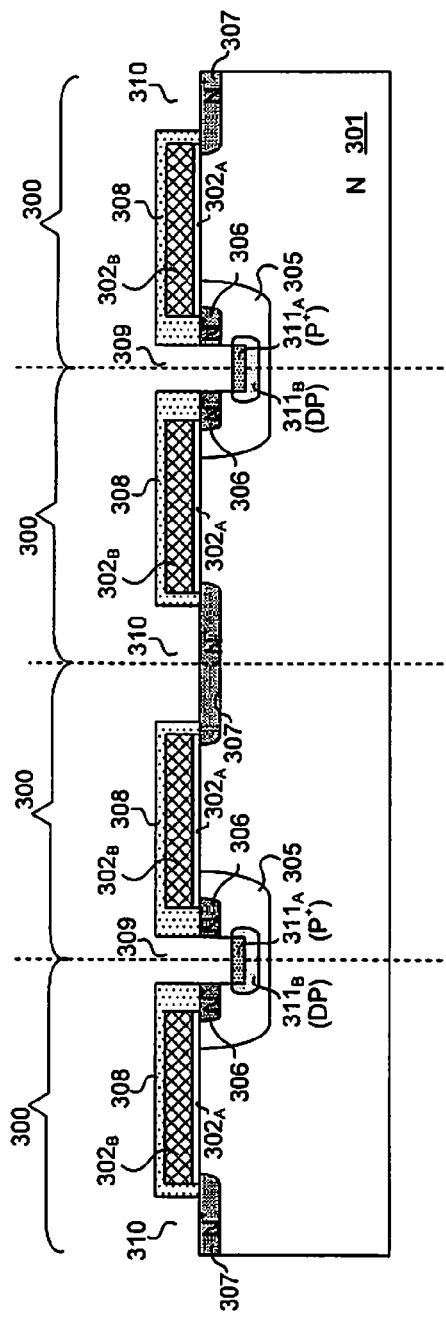

At a fifth step, as illustrated in FIG. 3E, a body contact region 311 is formed in the body region 305. In one embodiment, forming the body contact region 311 may comprise: implanting a substance of the second conductivity type (e.g. P-type in FIG. 3E) with the second dopant concentration into the body region 305 via the source contact opening 309 to form a first body contact region $311_A$. In other embodiments, forming the body contact region 311 may further comprise: implanting a substance of the second conductivity type with the third dopant concentration into the body region 305 via the source contact opening 309 to form a second body contact region $311_B$ before forming the first body contact region $311_A$.

In yet other embodiments, at the fifth step, forming the body contact region 311 may further comprise forming a silicide layer atop the first body contact region $311_A$ and along sidewalls of the source contact opening 309.

Figure 3F:
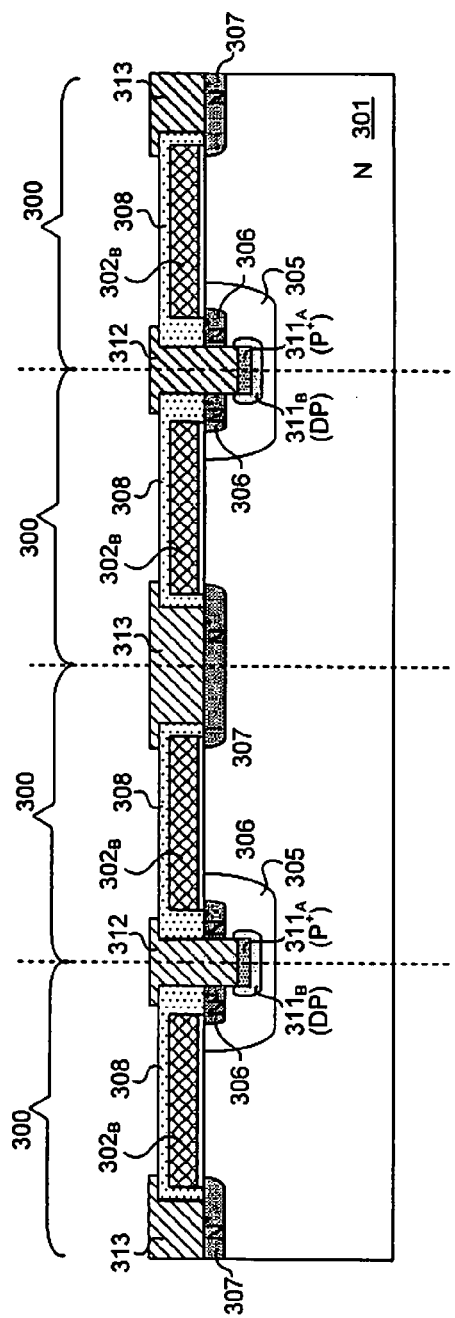

At a sixth step, as illustrated in FIG. 3F, a recessed source contact $312_A$ is formed. In one embodiment, forming the recessed source contact $312_A$ may comprise: forming a metal layer 312 which covers the isolation layer 308 and fills the source contact opening 309 and the drain contact opening 310; etching the metal layer 312 to form individual recessed source contacts $312_A$. In one embodiment, a drain contact $312_B$ is also formed at the same step when the source contact $312_A$ is formed. In other embodiments, the drain contact $312_B$ may be formed in a separate step.

FIGS. 4A to 4G illustrate another fabrication process of forming a lateral DMOS 400 in accordance with an embodiment of the present invention.

Figure 4A:
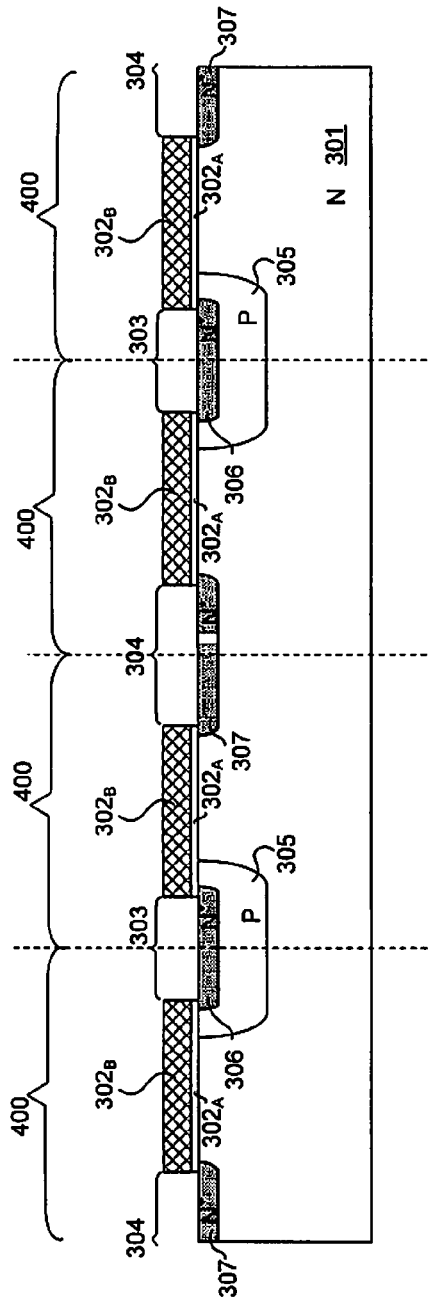

As shown in FIG. 4A, originally an initial layer 301 of a first conductivity type (e.g. N-type in FIG. 4A) is provided and in the following steps a gate 302, a source opening 303, a drain opening 304, a body region 305 of a second conductivity type (e.g. a P-type region in FIG. 4A) with a first dopant concentration, a source region 306 of the first conductivity type with a heavy dopant concentration (e.g. an N+ region in FIG. 4A) and a drain region 307 of the first conductivity type with a heavy dopant concentration (e.g. an N+ region in FIG. 4A) are formed. Methods and processes of forming the gate 302, the source opening 303, the drain opening 304, the body region 305, the source region 306 and the drain region 307 are already described previously with reference to FIGS. 3A to 3C (3C'), and may not be described again in detail herein to avoid obscuring aspects of the technology.

Figure 4B:
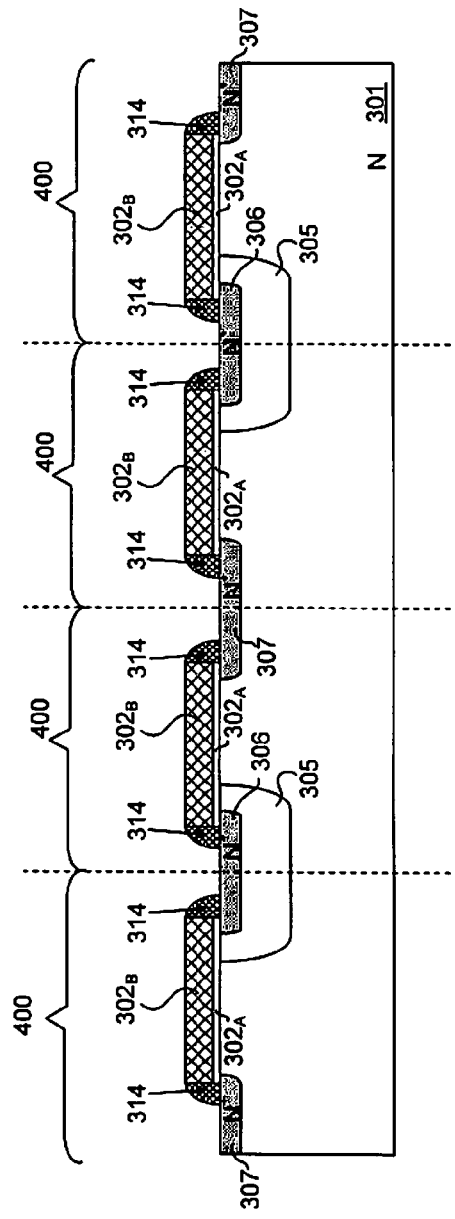

In a next step, as illustrated in FIG. 4B, a spacer 314 is formed adjacent to the gate 302, at each side of the gate 302. Similar as described previously, the spacer 314 may comprise a material that has different etching characteristics from the gate 302, the source region 306 and the body region 305. For example, spacer 314 may comprise a dielectric material such as silicon dioxide or silicon nitride.

In a next step, as illustrated in FIG. 4C, a source contact recess 315 having sidewalls self-aligned to the spacer 314 is formed, wherein the source contact recess 315 vertically extends through the source region 306 to reach the body region 305. In one embodiment, forming the source contact recess 315 may comprise etching the source region 306 with the shield of the spacer 314 till a bottom of the source contact recess 315 reaches into the body region 305. Because the silicon etch used to form the source contact recess 315 may also etch the material comprising the gate 302 (e.g. polysilicon), in one embodiment a protection layer such as silicon dioxide is formed on top of the gate 302 to protect the gate 302 from etching during the formation of the source contact recess 315.

In a next step, as illustrated in FIG. 4D, a body contact region 311 is formed in the body region 305 via the source contact recess 315. Similar as described previously with reference to FIG. 3E, in one embodiment, forming the body contact region 311 may comprise forming a first body contact region $311_A$ of the second conductivity type with a second dopant concentration (e.g. a P$^+$ region in FIG. 4D) in the body region 305 via the source contact recess 315. In another embodiment, forming the body contact region 311 may further comprise forming a second body contact region $311_B$ of the second conductivity with a third dopant concentration (e.g. a DP region in FIG. 4D) in the body region 305 via the source contact recess 315.

Figure 4E:
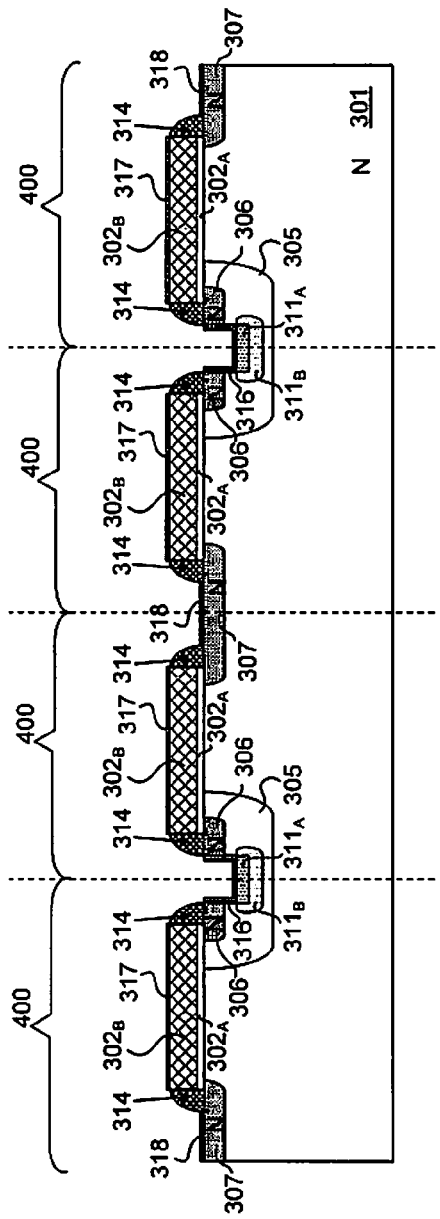

In a next step, as illustrated in FIG. 4E, a silicide layer 316 is formed along the bottom and sidewalls of the source contact recess 315. Optionally, in one embodiment, a silicide layer 317 and/or a silicide layer 318 are also formed respectively atop the gate 302 and the drain region 307 in this step. In the exemplary process illustrated in FIG. 4E, a self-aligned silicide layer is formed on all exposed silicon and polysilicon surfaces, while spacer 314 prevents silicide formation between the gate 302 and the source region 306.

Figure 4F:
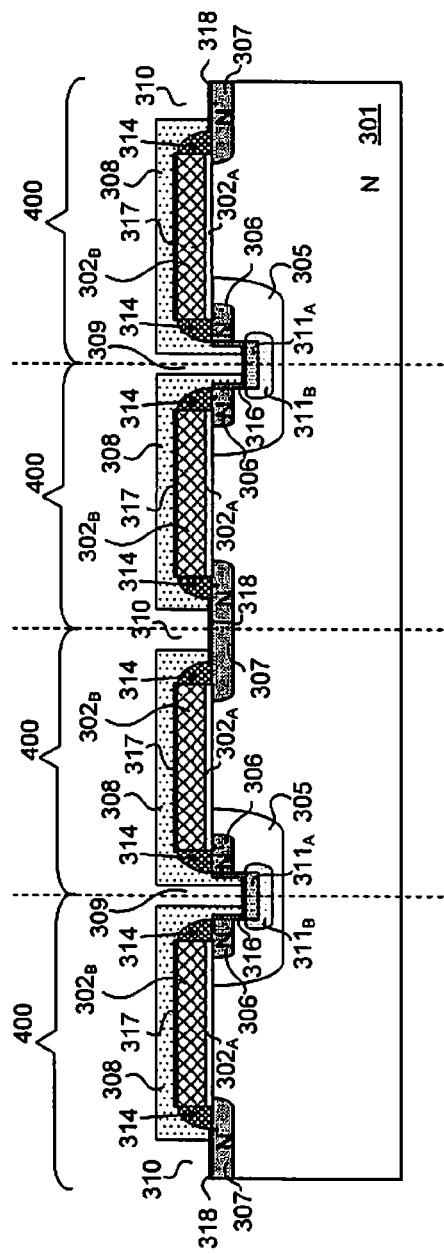

In a next step, as illustrated in FIG. 4F, a second isolation layer 308 is formed to cover all the exposed surfaces on top of the lateral DMOS 400 and then a source contact opening 309 is formed in the source contact recess 315, wherein the source contact opening 309 is etched through the second isolation layer 308 in the source contact recess 315 to reach the silicide layer 316. In one embodiment, a drain contact opening 310 is also formed at the same step when the source contact opening 309 is formed, wherein the drain contact opening 310 is etched through the second isolation layer 308 to reach the drain region 307 or the silicide layer 318.

Figure 4G:
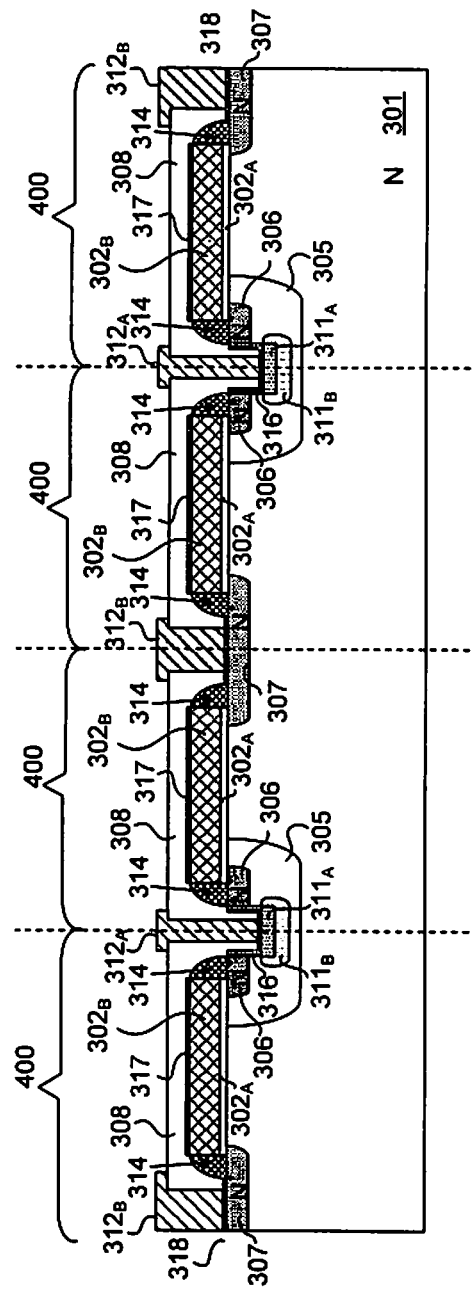

In a next step, as illustrated in FIG. 4G, a recessed source contact $312_A$ is formed. In one embodiment, a drain contact $312_B$ is also formed at the same step when the source contact $312_A$ is formed. Methods and processes of forming the recessed source contact $312_A$ and the drain contact $312_B$ are described previously with reference to FIG. 3F and will not be described in detail herein.

Figure 5:
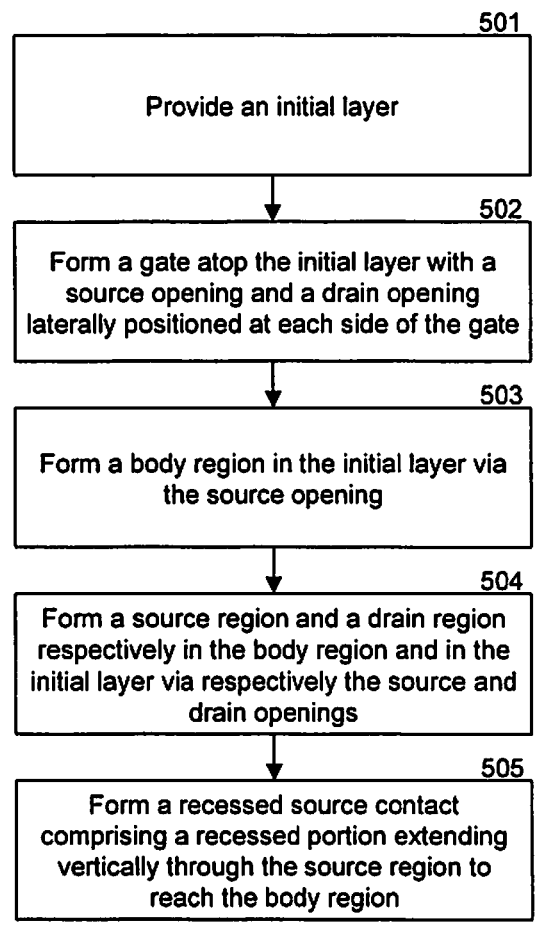
FIG. 5 shows a flow chart illustrating a method of forming a lateral DMOS in accordance with an embodiment of the present invention.

FIG. 5 shows a flow chart illustrating a method of forming a lateral DMOS in accordance with an embodiment of the present invention. The method comprises: providing an initial layer of a first conductivity type at step 501; forming a gate atop the initial layer at step 502, wherein a source opening and a drain opening are formed after the gate is formed, and wherein the gate is laterally positioned between the source opening and the drain opening; forming a body region of a second conductivity type having a first dopant concentration in the initial layer via the source opening at step 503; forming a source region of the first conductivity type in the body region and a drain region of the first conductivity type in the initial layer via respectively the source opening and the drain opening at step 504; and forming a recessed source contact comprising a recessed portion extending vertically through the source region to reach the body region at step 505, wherein the recessed portion is electrically coupled to the source region and the body region. In one embodiment, processes of forming the gate, the body region, the source region and the drain region at steps 501 to 504 comprise processes described previously with reference to FIGS. 3A to 3C(3C'). In one embodiment, processes of forming the recessed source contact comprise processes described previously with reference to FIGS. 3D to 3F. In other embodiment, processes of forming the recessed source contact comprise processes described previously with reference to FIGS. 3D' to 3F. In still other embodiment, processes of forming the recessed source contact comprise processes described previously with reference to FIGS. 4B to 4G.

Methods and processes of forming a lateral DMOS described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

Although the present disclosure takes an N-channel lateral DMOS for example to illustrate and explain the structures and manufacturing processes of a lateral DMOS with recessed source contact according to the present invention, but this is not intended to be limiting and persons of skill in the art will understand that the structures and principles taught herein also apply to P-channel lateral DMOS and to other types of semiconductor materials and devices as well.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the technology is not limited except as by the appended claims.

We claim:

1. A semiconductor device, comprising:
   an initial layer of a first conductivity type;
   a body region of a second conductivity type having a first dopant concentration, wherein the body region is located in the initial layer;
   a source region of the first conductivity type, wherein the source region is located in the body region;
   a drain region of the first conductivity type, wherein the drain region is located in the initial layer;
   a gate atop a portion of the initial layer, wherein the portion of the initial layer is between the source region and the drain region;
   a spacer adjacent to each side of the gate;
   a recess extending vertically through the source region to reach the body region, wherein the recess having body contacts contacting the body region, and sidewalls of the recess are laterally self-aligned to the spacer;
   a silicide layer along the bottom and sidewalls of the recess; and
   a recessed source contact comprising a recessed portion extending vertically through the source region to reach the body region, wherein the recessed source contact is inside the recess and the recessed portion of the recessed source contact is electrically coupled to the source region and the body region via the silicide layer.

2. The semiconductor device of claim 1 further comprising a first body contact region of the second conductivity type having a second dopant concentration, wherein the first body contact region is below and in contact with the recessed source contact, and wherein the second dopant concentration is higher than the first dopant concentration.

3. The semiconductor device of claim 2 further comprising a second body contact region of the second conductivity type having a third dopant concentration, wherein the second body contact region encloses the first body contact region, and wherein the second body contact region is in contact with the first body contact region, and wherein the third dopant concentration is higher than the first dopant concentration and lower than the second dopant concentration.

4. The semiconductor device of claim 1 further comprising a first lightly doped region of the first conductivity type in the body region, wherein the first lightly doped region is beside and in contact with the source region, and wherein the first lightly doped region extends below the gate.

5. The semiconductor device of claim 1 further comprising a second lightly doped region of the first conductivity type in the initial layer, wherein the second lightly doped region is beside and in contact with the drain region, and wherein the second lightly doped layer extends below the gate.

\* \* \* \* \*